US008436332B2

(12) United States Patent
Yoshinari

(10) Patent No.: US 8,436,332 B2
(45) Date of Patent: May 7, 2013

(54) ELECTRON EMISSION ELEMENT AND IMAGING DEVICE HAVING THE SAME

(75) Inventor: Masaki Yoshinari, Kai (JP)

(73) Assignees: Pioneer Corporation, Kanagawa (JP); Pioneer Micro Technology Corporation, Yamanashi (JP)

( * ) Notice: Subject to any disclaimer, the term of this patent is extended or adjusted under 35 U.S.C. 154(b) by 0 days.

(21) Appl. No.: 13/512,890

(22) PCT Filed: Dec. 17, 2009

(86) PCT No.: PCT/JP2009/006958
§ 371 (c)(1), (2), (4) Date: May 31, 2012

(87) PCT Pub. No.: WO2011/074038
PCT Pub. Date: Jun. 23, 2011

(65) Prior Publication Data

US 2012/0235113 A1 Sep. 20, 2012

(51) Int. Cl.
*H01L 29/06* (2006.01)

(52) U.S. Cl.
USPC ..................... 257/10; 257/E21; 257/E49.004; 257/E31.004; 438/20; 438/22; 438/29; 438/30; 313/311

(58) Field of Classification Search .................... 257/10, 257/53, E21, E49.004, E31.095; 438/20, 438/22, 29–30, 34, 91, 257, 259, 747, 750, 438/754, 756; 313/311, 498
See application file for complete search history.

(56) References Cited

U.S. PATENT DOCUMENTS

| | | | |
|---|---|---|---|
| 2002/0117953 | A1 | 8/2002 | Kuo et al. |
| 2003/0089900 | A1 | 5/2003 | Chen et al. |
| 2005/0184220 | A1 | 8/2005 | Okuda et al. |
| 2009/0284129 | A1 | 11/2009 | Tanaka et al. |

FOREIGN PATENT DOCUMENTS

| | | |
|---|---|---|
| JP | 2002-260546 | 9/2002 |
| JP | 2004-127935 | 4/2004 |
| JP | 2005-228556 | 8/2005 |
| JP | 2006-040725 | 2/2006 |
| WO | 2007/114103 | 10/2007 |
| WO | 2007/119524 | 10/2007 |

OTHER PUBLICATIONS

International Search Report—PCT/JP2009/006958—Feb. 16, 2012.

*Primary Examiner* — Evan Pert
*Assistant Examiner* — Mark A Laurenzi
(74) *Attorney, Agent, or Firm* — Young & Thompson

(57) ABSTRACT

An electron emission element has an electron emission layer that emits an electron from a surface emission portion, a focusing electrode layer that is film-formed on a surface of the electron emission layer via a first insulation layer and focuses the emitted electron, a gate electrode layer that is film-formed on a surface of the focusing electrode layer via a second insulation layer, an emission concave portion that penetrates the gate electrode layer, the second insulation layer, the focusing electrode layer and the first insulation layer and opens in a concave shape on a surface of the surface emission portion, a carbon layer that is film-formed from a surface of the gate electrode layer over an inner peripheral surface of the emission concave portion, and a partial insulation portion that insulates the focusing electrode layer from the carbon layer.

14 Claims, 10 Drawing Sheets

ELECTRON EMISSION ELEMENT AND IMAGING DEVICE HAVING THE SAME

TECHNICAL FIELD

The present invention relates to an electron emission element having a focusing electrode which focus electrons emitted from a surface emission portion and an imaging device having the same.

BACKGROUND ART

Recently, in technology where electrons are emitted by an electric field without heating a negative electrode (cathode electrode), a so-called electron emission element of a surface emission type has been proposed (see Patent Document 1). The electron emission element has an aperture (emission concave portion) which penetrates an insulation layer and a gate electrode layer stacked on an electron emission layer and a carbon layer stacked on the gate electrode layer and an inner surface of the aperture, and emits electrons from an electron emission layer exposed at a bottom of the aperture by applying voltage to the gate electrode layer.

[Patent Document 1] WO2007-114103

DISCLOSURE OF THE INVENTION

Problems that the Invention is to Solve

When the electron emission element is packed to mount in an imaging device, the electron emission element is disposed to face a substrate having an anode electrode and a photoelectric conversion layer via vacuum space therebetween, emitted electrons are coupled with holes in the photoelectric conversion layer and electric current at that time is detected as video signals. At this time, electron beams need to be focused on a surface of the photoelectric conversion layer in order to make the emitted electrons strike with holes in the photoelectric conversion layer efficiently.

In the above electron emission element of the surface emission type, it has been considered to provide a focusing electrode layer which focuses electrons using an electric field by applying voltage having electric potential different from that of the gate electrode layer so as not to broaden tracks of emitted electrons (electric beams). Such a structure may cause a trouble in which the gate electrode layer and the focusing electrode layer are conducted by the carbon layer film-formed on the inner peripheral surface of the emission concave portion at the end of a fabrication process. Thus, the gate electrode layer and the focusing electrode layer have same electric potential difference and sufficient electric potential difference is not generated therebetween, and a problem such that electrons can not be focused may be conceived.

It is an advantage of the invention to provide an electron emission element of a surface emission type in which a gate electrode layer and a focusing electrode layer can not be conducted through a carbon layer even the focusing electrode layer is provided and to provide an imaging device having the same.

Means for Solving the Problems

According to an aspect of the invention, there is provided an electron emission element having an electron emission layer that emits an electron from a surface emission portion, a focusing electrode layer that is film-formed on a surface of the electron emission layer via a first insulation layer and focuses the emitted electron, a gate electrode layer that is film-formed on a surface of the focusing electrode layer via a second insulation layer, an emission concave portion that penetrates the gate electrode layer, the second insulation layer, the focusing electrode layer and the first insulation layer and opens in a concave shape on a surface of the surface emission portion, a carbon layer that is film-formed from a surface of the gate electrode layer over an inner peripheral surface of the emission concave portion, and a partial insulation portion that is film-formed by a different process from the first insulation layer and the second insulation layer and that insulates the focusing electrode layer from the carbon layer, the partial insulation portion being made up of at least a side wall disposed between the carbon layer and the focusing electrode layer among side walls that are disposed between the carbon layer and the gate electrode layer, between the carbon layer and the second insulation layer, between the carbon layer and the focusing electrode layer, and between the carbon layer and the first insulation layer.

According to another aspect of the invention, there is provided an electron emission element having an electron emission layer that emits an electron from a surface emission portion, a gate electrode layer that is film-formed on a surface of the electron emission layer via a first insulation layer, a focusing electrode layer that is film-formed on a surface of the gate electrode layer via a second insulation layer and focuses the emitted electron, a third insulation layer that is stacked on a surface of the focusing electrode layer, an emission concave portion that penetrates the third insulation layer, the focusing electrode layer, the second insulation layer, the gate electrode layer and the first insulation layer, and opens in a concave shape on a surface of the surface emission portion, a carbon layer that is film-formed from a surface of the third insulation layer to an inner peripheral surface of the emission concave portion, and a partial insulation portion that is film-formed by a different process from the first insulation layer, the second insulation layer and the third insulation layer and that insulates the focusing electrode layer from the carbon layer, the partial insulation portion being made up of at least a side wall disposed between the carbon layer and the focusing electrode layer among side walls that are disposed between the carbon layer and the third insulation layer, between the carbon layer and the focusing electrode layer, between the carbon layer and the second insulation layer, between the carbon layer and the gate electrode layer, and between the carbon layer and the first insulation layer.

With the structures described above, since the focusing electrode layer and the gate electrode layer are not conducted via the carbon layer by the partial insulation portion which insulates the focusing electrode layer from the carbon layer, voltage having different potential from that of the gate electrode layer can be applied to the focusing electrode layer, thereby it is possible to focus the electrons (electron beams) emitted from the surface emission portion.

The gate electrode layer and the focusing electrode layer are preferably made from tungsten (W) especially, and may be made from metal such as Si, Al, Ti, TiN, Cu, Ag, Cr, Au, Pt, C.

With these structures described above, it is possible to select where to form the side wall based on geometry of the emission concave portion or film-formation/etching processes. Further, since the side walls are formed between the carbon layer and layers other than the focusing electrode layer, it is possible to omit complex film formation/etching processes and to form the partial insulation portion which insulates the carbon layer from the focusing electrode layer easily.

In this case, film thickness (film width) of the side wall is formed to be approximately equal to thickness of the second insulation layer to achieve same insulation performance.

With the structure described above, the focusing electrode layer is sufficiently insulated from the carbon layer as well as the gate electrode layer, and it is possible to avoid that a purpose of the side wall can be spoiled by leak current from the second insulation layer. Thus, it is possible to insulate between the focusing electrode layer and the gate electrode layer properly. In a case that the side wall and the second insulation layer are made of same insulation material, it is preferable that film thickness (film width) of the side wall and that of the second insulation layer be the same.

Further, in these cases, it is preferable that the electron emission layer be made of amorphous silicon, and the partial insulation portion be made of oxide or nitride.

With the structure described above, the partial insulation portion promotes to oxidize the electron emission layer and electron emission performance of the surface emission portion can be enhanced. Oxide silicon (SiOx) is especially preferable for the oxide constituting the partial insulation portion, and metal oxide such as WOx, AlOx, TiOx, CuOx, AgOx, CrOx, MgOx and metallic composite oxide such as $MgAl2O_4$, $BaTiO_3$ may be used.

Further, in these cases, it is preferable that voltage be applied to the gate electrode layer and the focusing electrode layer respectively such that electric potential of the focusing electrode layer is lower than that of the gate electrode layer.

With the structure described above, since the focusing electrode layer can be functioned by lower voltage than that applied to the gate electrode layer, it is possible to provide the electron emission element which emits electrons by low voltage as a whole.

Further, in these cases, the electric potential of the focusing electrode layer may be negative electric potential.

With the structure described above, since electric potential difference between the gate electrode layer and the focusing electrode layer can be large, focusing effect by the focusing electrode can be sufficiently enhanced even the applied voltage is low in total.

Further, in these cases, it is preferable that the emission concave portion is formed to be larger in an electron emission direction.

With the structure described above, since layer end of each electrode layer and each insulation layer positioned above the emission concave portion do not block tracks of emitted electrons (attenuation of electron beams), the electrons can be emitted efficiently.

According to the other aspect of the invention, there is provided an imaging device having an electron emission substrate section that has the electron emission element described above and a cathode electrode, and a light reception substrate section that faces the electron emission substrate section having vacuum space therebetween and, has a photoelectric conversion layer and an anode electrode.

With the structure described above, it is possible to focus emitted electrons on a front surface of the photoelectric conversion layer efficiently and to provide the imaging device of a power saving type having high detection accuracy.

DESCRIPTION OF EXEMPLARY EMBODIMENTS

An electron emission element according to a first embodiment of the invention and an imaging device having the same will be explained with reference to accompanying drawings. The electron emission element is an electron emission element, as it is called, of a surface emission type having an electron source of a cold cathode type, and the imaging device is constructed by an electron emission element array in which a plurality of electron emission elements are disposed in a matrix shape and a photoelectric conversion film which faces the electron emission element array having vacuum space therebetween.

<First Embodiment>

Figure 1:
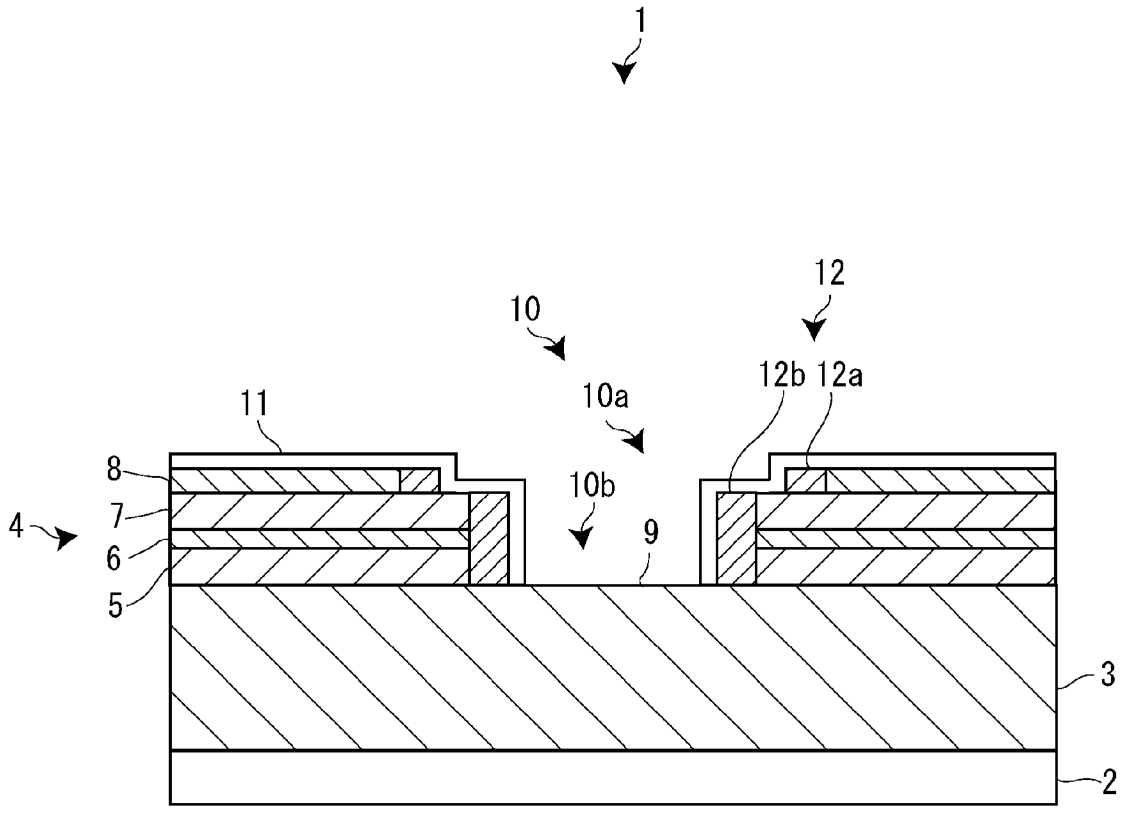
FIG. 1 is an enlarged cross sectional view around an emission concave portion of an electrode emission element according to a first embodiment of the invention.

As illustrated in FIG. 1, an electron emission element 1 has a cathode electrode layer 2, an electron emission layer 3 stacked on the cathode electrode layer 2 and made of amorphous silicon (a-Si), and an electrode layer portion 4 formed on the electron emission layer 3 and having a plurality of electrode layers and insulation layers. The electrode layer portion 4 has a first insulation layer 5 film-formed on the electron emission layer 3, a focusing electrode layer 6 film-formed on the first insulation layer 5, a second insulation layer 7 film-formed on the focusing electrode layer 6 and a gate electrode layer 8 film-formed on the second insulation layer 7. Further, at the electron layer portion 4, an electron emission concave portion 10 in a concave shape which penetrates each layer and through which the electron emission layer 3 is exposed at a bottom thereof. A surface emission portion 9 as an emission site is formed on the exposed portion of the electron emission layer 3. Still further, on a surface of the gate electrode layer 8 and an inner peripheral surface of the electron emission concave portion 10, a carbon layer 11 is film-formed, and an insulating side wall 12 made of oxide silicon (SiOx) is formed between the carbon layer 11 and the inner peripheral surface of the election emission concave portion 10. Though details are described later, an array of the electron emission elements 1 (electron emission concave portions 10) forms an imaging element (pixel) 113 (see FIG. 7).

When desired voltage is applied to the gate electrode layer 8 as having the cathode electrode layer 2 as ground potential, a strong electric field is generated at the surface emission portion 9 of the electron emission layer 3. Electrons in the electron emission layer 3 are accelerated by the generated electric field and are emitted from the surface emission portion 9 by tunnel effect. At this moment, if voltage having lower electric potential than that of the gate electrode layer 8 is applied to the focusing electrode layer 6 (having electric potential difference), the emitted electrons (electronic beams) are focused, and beam spots thereof are focused narrowly and are supplied to a rear surface of a photoelectric conversion layer 123 described later. The carbon layer 11 film-formed on the surface of the gate electrode layer 8 and the inner peripheral surface of the electron emission concave portion 10 electrically conducts the gate electrode layer 8 with the surface emission portion 9 and excites emission of electrons. Further, the carbon layer 11 cooperates with the electron emission layer 3 made of amorphous silicon to enhance electron emission performance of the surface emission portion 9. The side wall 12 insulates the focusing electrode layer 6 from the carbon layer 11, and avoids conduction between the gate electrode layer 8 and the focusing electrode layer 6 via the carbon layer 11 (described later for details).

The electron emission concave portion 10 has an upper emission concave portion 10*a* surrounded by a layer end of the gate electrode layer 8 film-formed on a top portion and a lower emission concave portion 10*b* surrounded by layer ends of the first insulation layer 5, the focusing electrode layer 6 and the second insulation layer 7, and is formed by double etching (described later for details). The upper emission concave portion 10*a* is formed such that the layer end of the gate electrode layer 8 recedes with respect to the layer ends of the first insulation layer 5, the focusing electrode layer 6 and the second insulation layer 7, and an upper portion of the electron emission concave portion 10 is formed larger than a lower portion thereof as a whole. This limits that the layer end of the gate electrode layer 8 projects (obstructs) on tracks of the electrons emitted from the surface emission portion 9.

The side wall 12 has an upper side wall 12*a* formed on the inner peripheral surface of the upper emission concave portion 10*a* (layer end of the receded gate electrode layer 8) and a lower side wall 12*b* formed on an inner peripheral surface (layer ends of the first insulation layer 5, the focusing electrode layer 6 and the second insulation layer 7) of the lower emission concave portion 10*b*. Since an etchback process is performed on the insulation material (SiOx) film-formed on the inner peripheral surface of the electron emission concave portion 10, the side wall 12 is thus divided. Further, the carbon layer 11 is evenly film-formed so as to cover the surface of the gate electrode layer 8, the upper side wall 12*a* and the lower side wall 12*b*. In the embodiment, the carbon layer 11 is not film-formed on the surface emission portion 9 as the bottom of the electron emission concave portion 10 to restrain undesired leakage current (leak) and heat by the carbon layer 11.

A material and film thickness of each layer film-formed on the electrode layer portion 4 will be explained. The gate electrode layer 8 is made of tungsten (W) and is film-formed having 60 nm (600 Å) film thickness. The focusing electrode layer 6 is made of tungsten as the gate electrode layer 8 and is film-formed having 50 nm (500 Å) film thickness which is thinner than that of the gate electrode layer 8. The gate electrode layer 8 and the focusing electrode layer 6 are preferably film-formed having film thickness ranging from 10 to 200 nm (100 to 2000 Å). Further, the gate electrode layer 8 and the focusing electrode layer 6 may be formed from metal such as Si, Al, Ti, TiN, Cu, Ag, Cr, Au, Pt, C instead of tungsten.

The first insulation layer 5 and the second insulation layer 7 are preferably made of same material (such as SiOx) as the side wall 12, and each of which is film-formed having 150 nm (1500 Å) film thickness. In other words, film thickness (of the second insulation layer 7) insulating between the gate electrode layer 8 and the focusing electrode layer 6 is 150 nm (1500 Å), and film thickness (of the first insulation layer 5, the focusing electrode layer 6 and the second insulation layer 7 in total) insulating between the gate electrode layer 8 and the electron emission layer 3 is 350 nm (3500 Å). The first insulation layer 5 and the second insulation layer 7 are preferably film-formed having film thickness ranging from 50 to 1000 nm (500 to 10000 Å).

The side wall 12 is made of oxide silicon (SiOx) described above and is film-formed having 150 nm (1500 Å) film thickness (width). In short, the side wall 12 (especially, the upper side wall 12*a*) has same thickness as the second insulation layer 7 insulating between the gate electrode layer 8 and the focusing electrode layer 6. Consequently, the focusing electrode layer 6 is insulated from the carbon layer 11 with same insulation performance by which the focusing electrode layer 6 is insulated from the gate electrode layer 8, and deterioration of the insulation performance by leak from the side wall 12 can be avoided. Further, when the electrons are emitted, the surface emission portion 9 is considered to be oxidized by heat of the generated strong electric field. The side wall 12 made of SiOx as an oxide promotes oxidation of the surface emission portion 9 made of amorphous silicon, thereby the electron emission performance of the surface emission portion 9 is enhanced. The side wall 12 may be made of metal oxide such as WOx, AlOx, TiOx, CuOx, AgOx, CrOx, MgOx instead of oxide silicon, metallic composite oxide such as $MgAl2O_4$, $BaTiO_3$, or nitride.

The voltage applied to the focusing electrode layer 6 is set lower than that applied to the gate electrode layer 8 (carbon layer 11). When electric potential of the gate electrode layer 8 is set at 20V, electric potential difference between concave spaces thereof is preferably 0V to 13V. Thus, voltage is applied to the focusing electrode layer 6 so that the focusing electrode layer 6 has sufficiently low electric potential than that of the gate electrode layer 8, and consequently, the applied voltage applied to the electron emission element 1 is held as low as possible in total. The voltage applied to the focusing electrode layer 6 may have negative electric potential to enhance focusing effect.

Figure 2A:
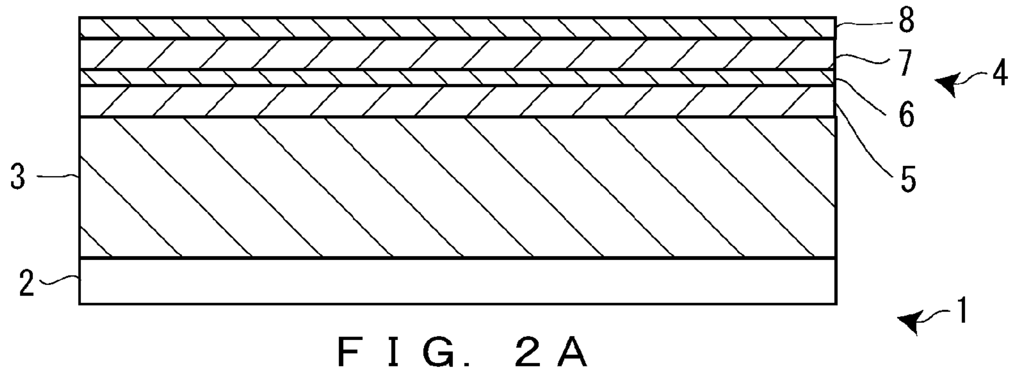
FIGS. 2A to 2C are views illustrating fabrication processes of the emission concave portion of the electron emission element according to the first embodiment.

Referring to FIGS. 2A to 4C, fabrication processes of the electron emission element 1 will be explained. FIGS. 2A to 2C illustrate fabrication processes of the upper emission concave portion 10*a*. First of all, the amorphous silicon as the electron emission layer 3, the oxide silicon as the first insulation layer 5, the tungsten as the focusing electrode layer 6, the oxide silicon as the second insulation layer 7 and the tungsten as the gate electrode layer 8 are sequentially film-formed (see FIG. 2A) by sputtering process and CVD process on the cathode electrode layer 2 formed on a substrate (not illustrated). At this moment, each layer is film-formed having the above mentioned film thickness (film thickness of the gate electrode layer 8=60 nm, film thickness of the focusing electrode layer 6=50 nm, film thickness of the first and the second insulation layers 5 and 6=150 nm).

Figure 2B:
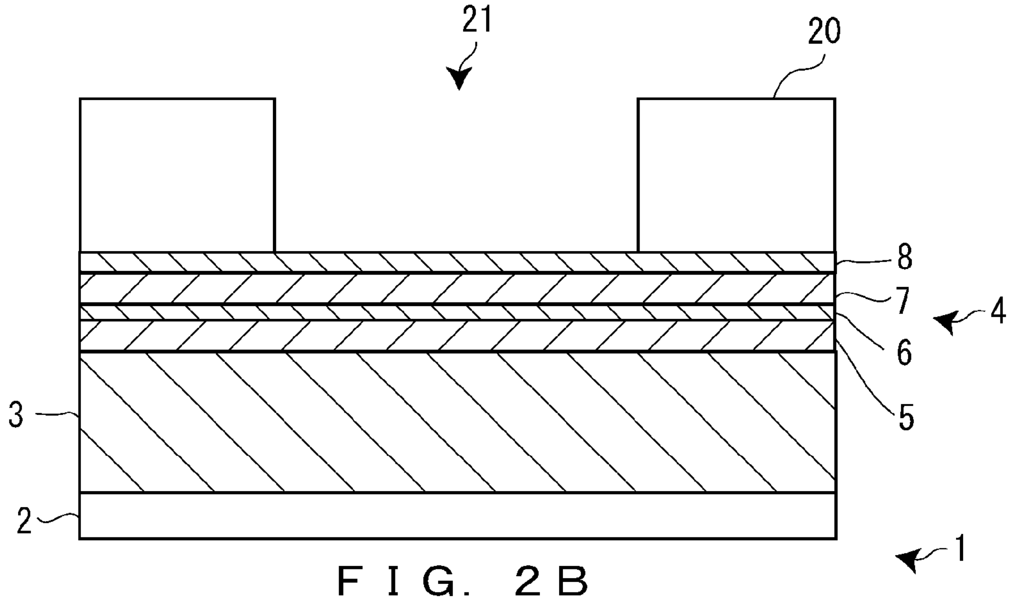
Figure 2C:
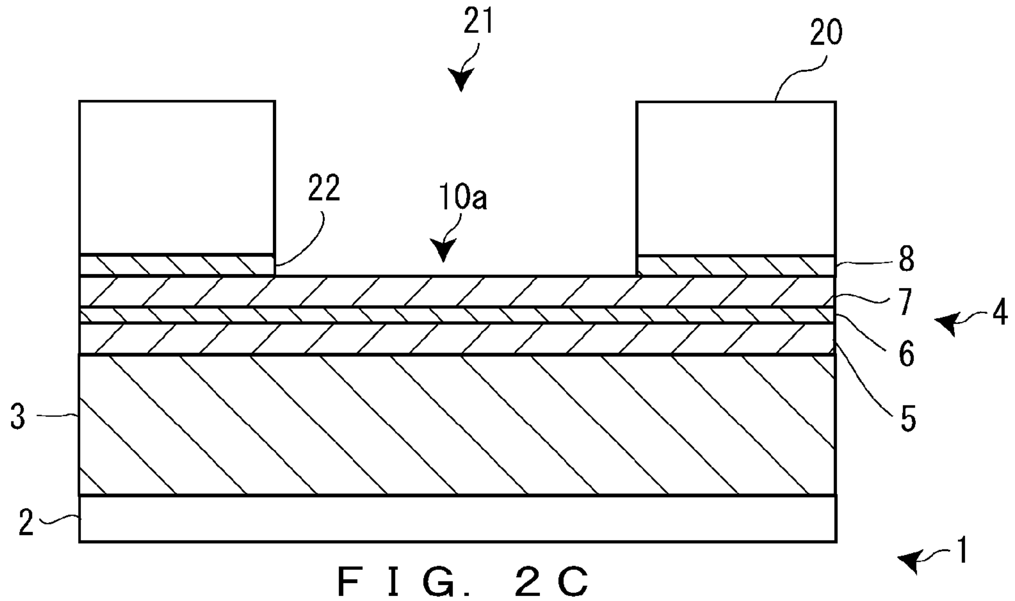

Then, a photo resist layer 20 is coated on the gate electrode layer 8 film-formed at the top portion by a spin coat process or the like, exposure/development processes are performed, and a resist pattern 21 having a resist ablation portion of which size is same as aperture size of the upper emission concave portion 10*a* is formed on a portion where the electron emission concave portion 10 (see FIG. 2B). In an actual process, a plurality of resist ablation portions in a matrix shape are formed to constitute an array of the electron emission elements 1. Then, a portion of the gate electrode layer 8 exposed by the formation of the resist pattern 21 is etched (anisotropic etching) by RIE (Reactive Ion Etching) process. Thus, only the portion (circular portion) of the gate electrode layer 8 is ablated and an aperture 22 as the upper emission concave portion 10*a* is formed on the second insulation layer 7 (see FIG. 2C). Then, only the photo resist layer 20 is ablated.

Figure 3A:
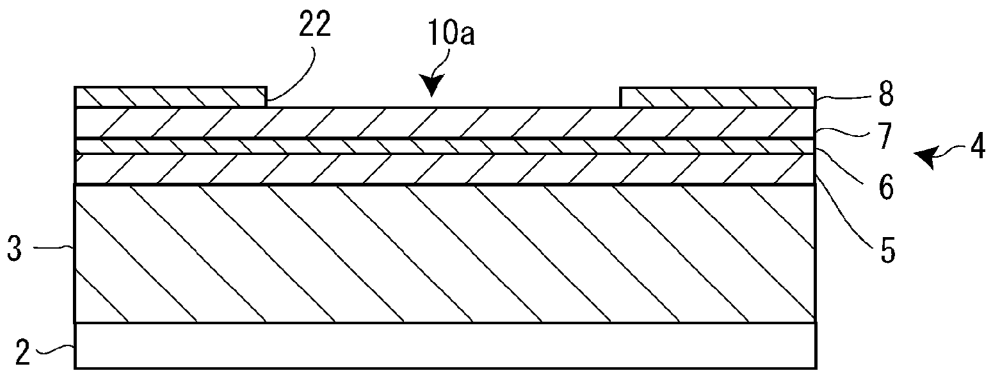
FIGS. 3A to 3C are views illustrating fabrication processes of the emission concave portion of the electron emission element according to the first embodiment.
Figure 3B:
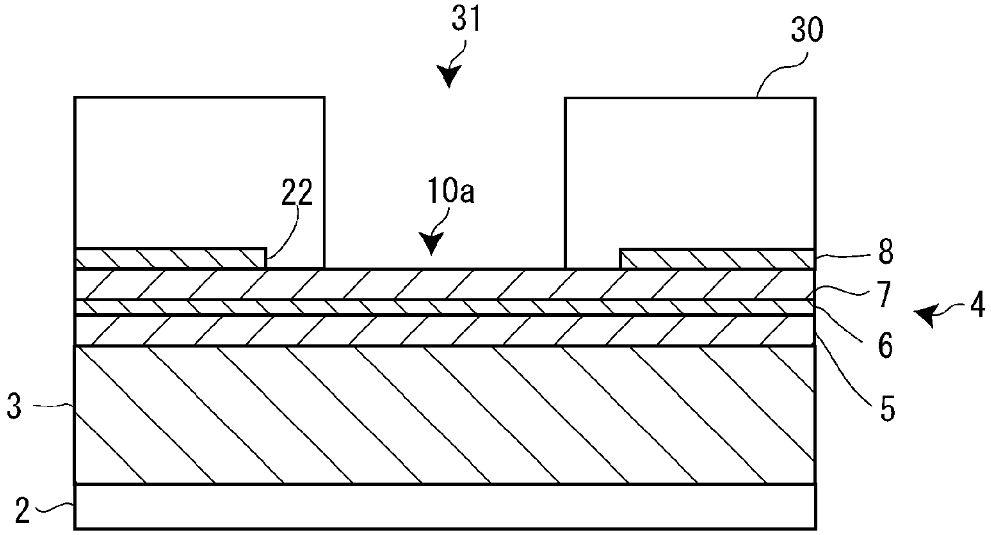
Figure 3C:
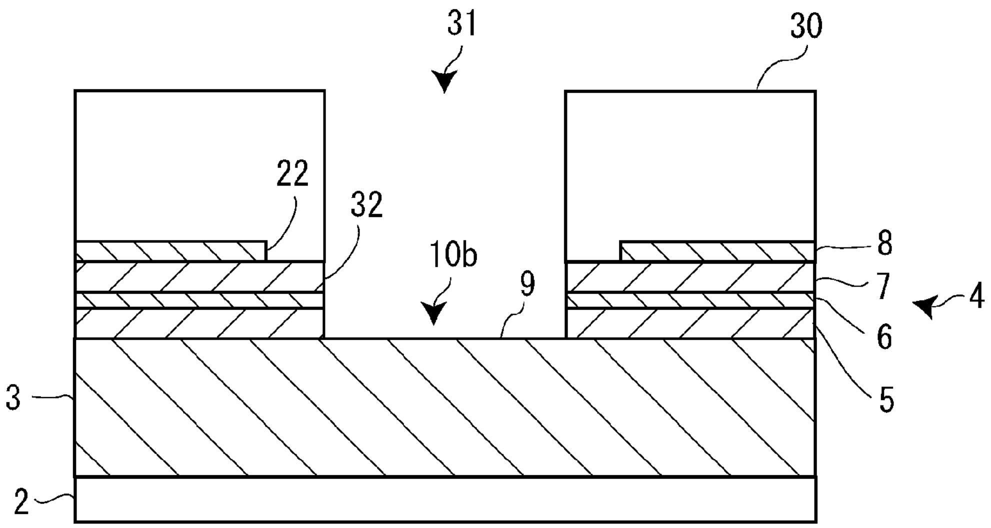

FIGS. 3A to 3C illustrates fabrication processes of the lower emission concave portion 10*b*. FIG. 3A illustrates a state where the photo resist layer 20 is ablated and the aperture 22 is formed at the gate electrode layer 8. First of all, a photo resist layer 30 is coated on the surface of the gate electrode layer 8 and the exposed second insulation layer 7 by spin coat process or the like, exposure/development processes are performed, and a resist pattern 31 having a resist ablation portion of which size is same as aperture size of the lower emission concave portion 10*b* is formed. At this moment, the resist pattern 31 is formed coaxially (concentrically) with the upper emission concave portion 10*a* and having a smaller diameter (see FIG. 3B). The first insulation layer 5, the focusing electrode layer 6 and the second insulation layer 7 are etched (anisotropic etching) via the formed resist pattern 31 by RIE process. Thus, a circular aperture 32 is formed on the electron emission layer 3, in which the first insulation layer 5, the focusing electrode layer 6 and the second insulation layer 7 are ablated. In short, the lower emission concave portion 10*b* is formed and the electron emission layer 3 (surface emission portion 9) is exposed on the bottom thereof (see FIG. 3C). Thereafter, only the photo resist layer 30 is ablated.

Figure 4A:
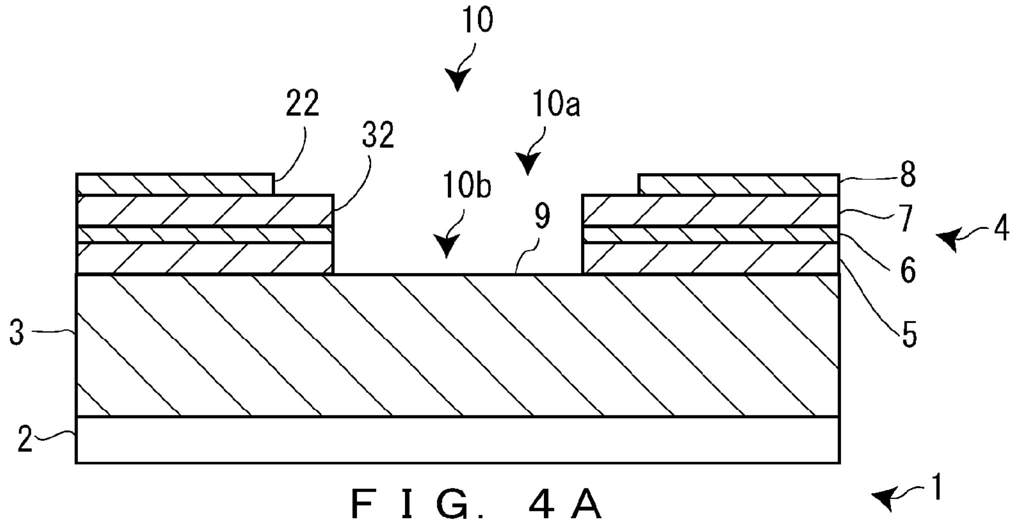
FIGS. 4A to 4C are views illustrating fabrication processes of the emission concave portion of the electron emission element according to the first embodiment.
Figure 4B:
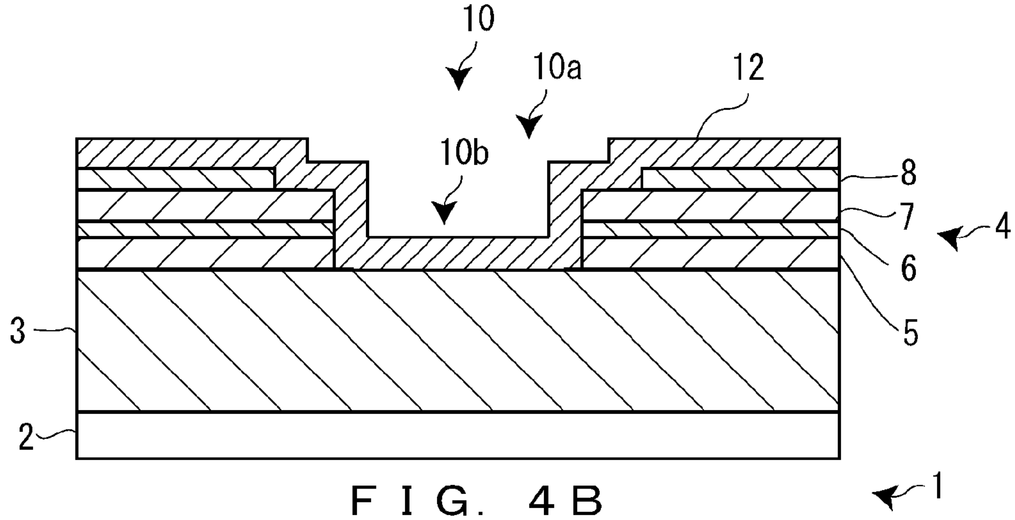
Figure 4C:
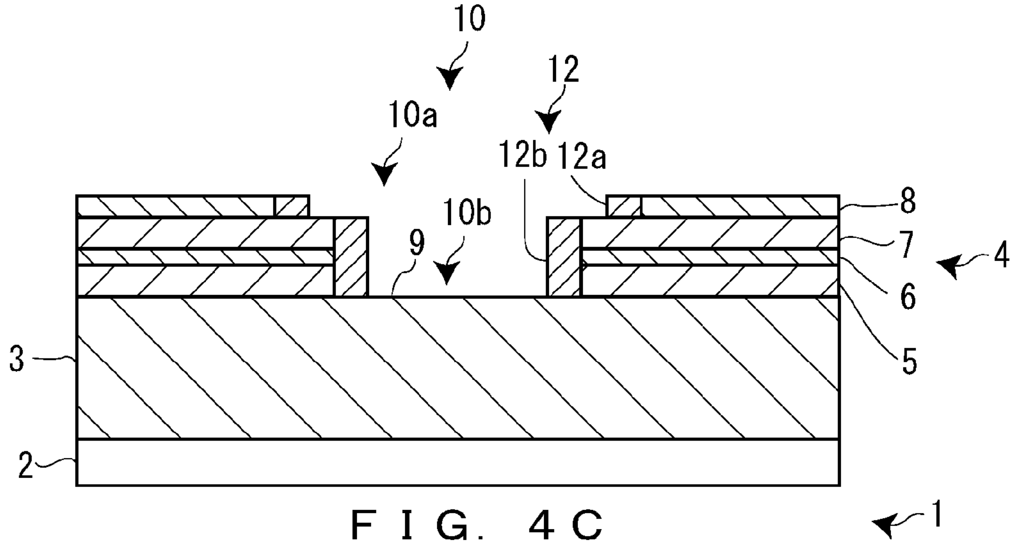

FIGS. 4A to 4C illustrate fabrication processes of the side wall 12. FIG. 4A illustrates a state where the photo resist layer 30 is ablated and the electron emission concave portion 10 is formed on the electron emission layer 3. First of all, oxide silicon as the side wall 12 is film-formed by CVD process or the like on the surface of the gate electrode layer 8, the inner peripheral surface of the electron emission concave portion 10 and the exposed electron emission layer 3 (surface emission portion 9). At this time, the oxide silicon is film-formed having film thickness (film width) (150 nm) of the above mentioned side wall 12 (see FIG. 4B). Then, the film-formed oxide silicon is etched back by RIE process until the surface of the gate electrode layer 8 is exposed. Thus, the oxide silicon is etched so as to have even thickness in the vertical direction against a layer surface, the surface of the gate electrode layer 8 and the surface emission portion 9 of the electron emission layer 3 are exposed, and the upper side wall 12*a* and the lower side wall 12*b* having 150 nm film thickness (film width) are formed on the inner peripheral surfaces of the upper emission concave portion 10*a* and the lower emission concave portion 10*b* (see FIG. 4C). Finally, the carbon layer 11 is film-formed by sputtering process or the like over the surface of the gate electrode layer 8 and the inner peripheral surface of the electron emission concave portion 10 (see FIG. 1).

Figure 5:
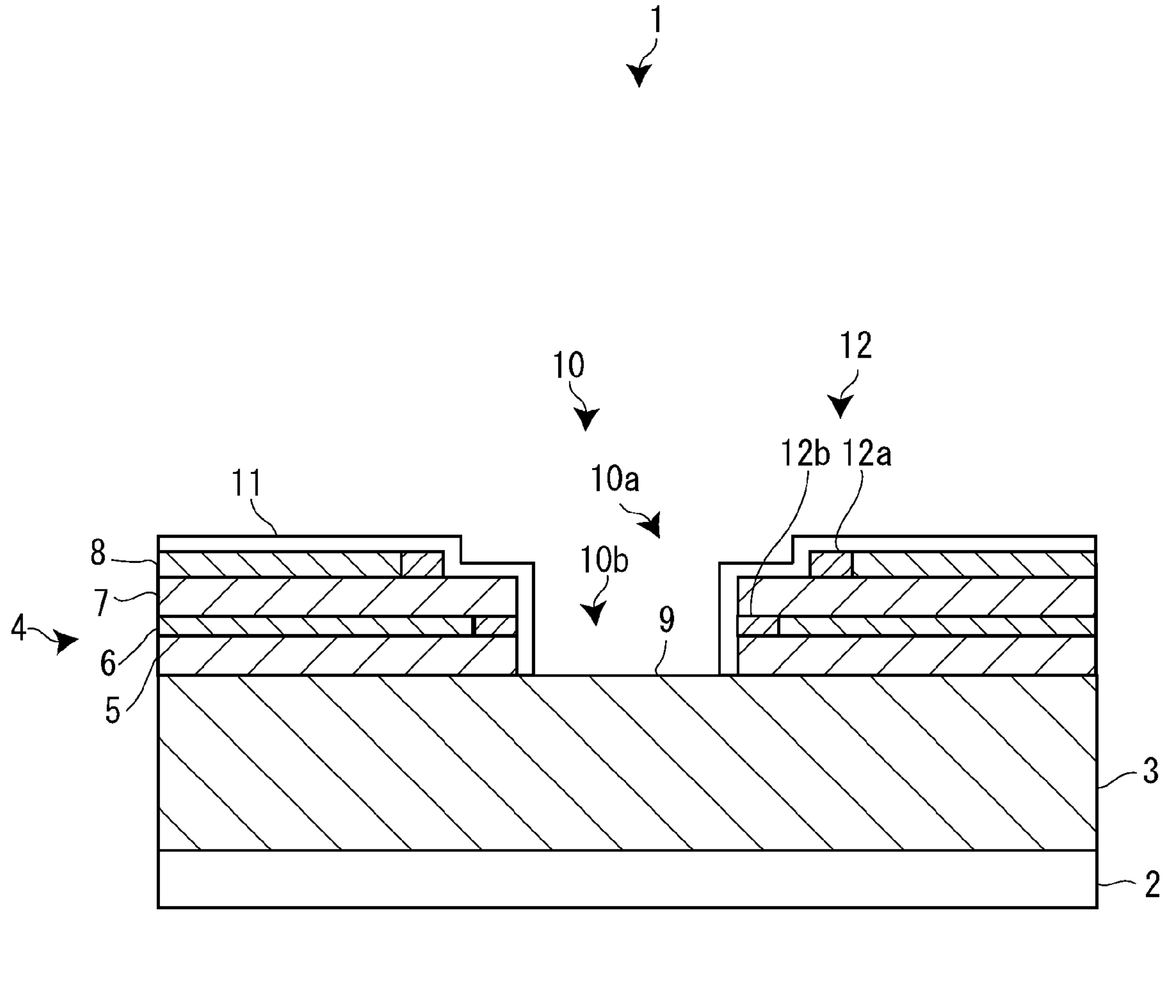
FIG. 5 is an enlarged cross sectional view illustrating the first modification of the emission concave portion of the electron emission element according to a first embodiment.
Figure 6:
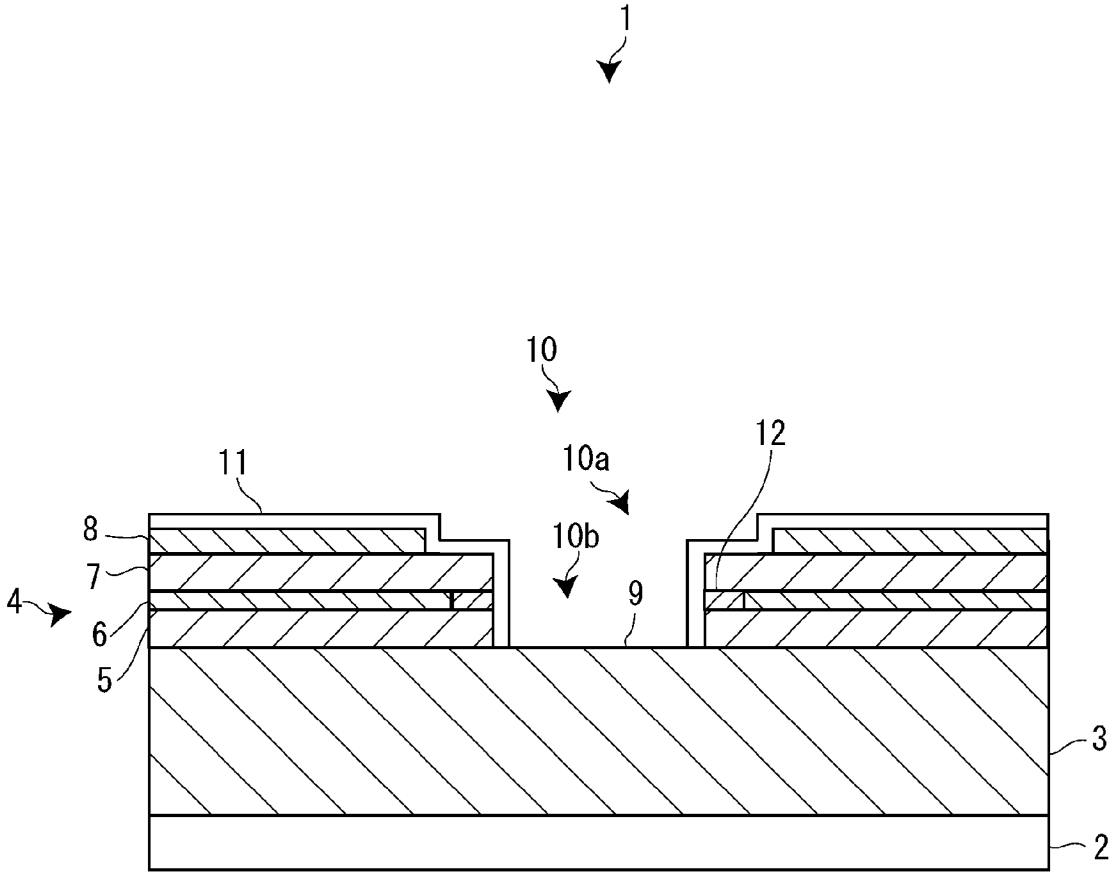
FIG. 6 is an enlarged cross sectional view illustrating a second modification of the emission concave portion of the electron emission element according to the first embodiment.

Referring to FIGS. 5 and 6, a modification of the electron emission element 1 of the first embodiment will be explained. FIG. 5 illustrates the electron emission element 1 according to the first modification of the first embodiment. As illustrated in FIG. 5, the side wall 23 according to the modification has the upper side wall 12*a* formed between the carbon layer 11 and the upper emission concave portion 10*a* (layer end of the gate electrode layer 8) and the lower side wall 12*b* formed only between the carbon layer 11 and a layer end of the focusing electrode layer 6 facing the lower emission concave portion 10*b*. The lower side wall 12*b* has same film thickness (film width) as that of the second insulation layer 7 and is formed to be embedded on the inner peripheral surface of the lower emission concave portion 10*b* so as to be in alignment with the layer ends of the first insulation layer 5 and the second insulation layer 7 which sandwich the focusing electrode layer 6 from above and underneath. Thus, the focusing electrode layer 6 is sufficiently insulated from the carbon layer 11 as the gate electrode layer 8, and the side wall 12 has a structure which can sufficiently avoid conducting the focusing electrode layer 6 to the gate electrode layer 8 via the carbon layer 11.

FIG. 6 illustrates the electron emission element 1 according to the second modification of the first embodiment. As illustrated, the side wall 12 according to the second modification is formed only between the carbon layer 11 and the layer end of the focusing electrode layer 6 facing the lower emission concave portion 10*b*. The side wall 12 has, as the lower side wall 12*b* in the first modification, same film thickness (film width) as that of the second insulation layer 7, and is embedded on the inner peripheral surface of the lower emission concave portion 10*b* so as to be in alignment with the layer ends of the first insulation layer 5 and the second insulation layer 7 which sandwich the focusing electrode layer 6 from above and underneath.

Since the side wall 12 is used for insulating between the focusing electrode layer 6 and the carbon layer 11, the side wall 12 is formed only between the focusing electrode layer 6 and the carbon layer 11, and the layer end of the gate electrode layer 8 and the carbon layer 11 are in a conductive state in this modification.

Figure 7:
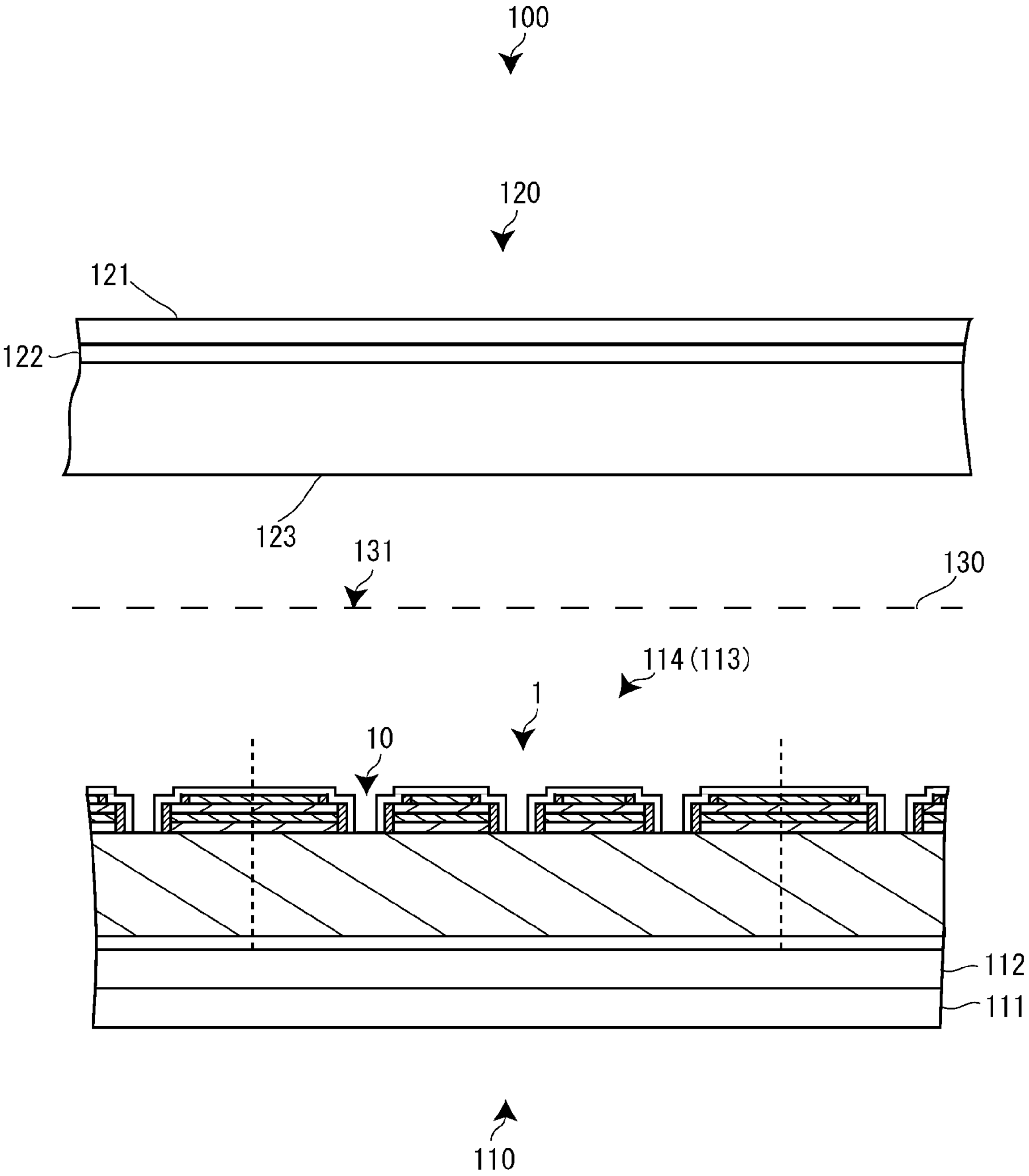
FIG. 7 is a schematic cross sectional view illustrating a structure of an imaging device according to the first embodiment.

Referring to FIG. 7, an imaging device 100 having the above electron emission elements 1 mounted thereon will be explained. FIG. 7 is a schematic cross sectional view of the imaging device 100. As illustrated, the imaging device 100 has an electron emission substrate section 110 on which a plurality of electron emission elements 1 are fabricated, a light reception substrate section 120 disposed to be a target of emitted electrons to face the electron emission substrate section 110 having vacuum space therebetween, and a mesh electrode 130 disposed away between the electron emission substrate section 110 and the light reception substrate section 120 and controlling tracks of the emitted electrons.

The electron emission substrate section 110 has a silicon substrate 111, a drive circuit layer 112 formed on the silicon substrate 111 and a plurality of imaging elements 113 formed in a matrix shape on the drive circuit layer 112. Each imaging device 113 functions as one pixel and is made up of an electron emission element array 114 in which the plurality of electron emission elements 1 are disposed in a matrix shape. In other words, the electron emission element array 114 constituting one imaging element 113 is driven integrally. The drive circuit layer 112 is made up of a drive circuit (not illustrated) having a MOS transistor array (switch) which drives the electron emission element arrays 114 (electron emission elements 1) and a horizontal/vertical scanning circuit which controls the MOS transistor array on a silicon substrate. A plurality of electron emission element array 114 (imaging elements 113) are driven (scanned) by the drive circuit sequentially point by point.

The light reception section 120 has a transparent glass substrate 121, an anode electrode layer 122 (transparent electrode) stacked on a rear surface of the glass substrate 121 and a photoelectric conversion layer 123 stacked on a rear surface of the anode electrode layer 122. When voltage is applied to the anode electrode layer 122, holes generated in the photoelectric conversion layer 123 are accelerated by incident light from the glass substrate 121 side and a hole pattern (not illustrated) corresponding to an incident light image is formed around a rear surface of the photoelectric conversion layer 123. The mesh electrode 130 controls tracks of the emitted electrons and is disposed between the electron emission substrate section 110 and the light reception substrate section 120 to absorb surplus electrons. Although not illustrated, the light reception substrate section 120 also has circuits to supply signals or voltages needed for driving the light reception substrate section 120, to output detected video signals, and the like.

In the imaging device 100, the emitted electrons from the electron emission concave portion 10 of the electron emission substrate section 110 pass through bores 131 of the mesh electrode 130, and unite with the hole pattern grown around a front surface of the photoelectric conversion layer 123 of the light reception substrate section 120. Video images are captured by detecting current at the time of uniting as video signals. In other words, different video signals are detected in the photoelectric conversion layer 123 based on difference of accumulation amount of holes per imaging element 113 by the hole pattern which reflects the incident light image, and strength/weakness of the video signals is sensed as brightness/darkness. A color filter may be formed on a surface of the light reception substrate section 120 (glass substrate 121). In this case, capturing by color is available by taking images (videos) of R/G/B separately.

<Second Embodiment>

Figure 8:
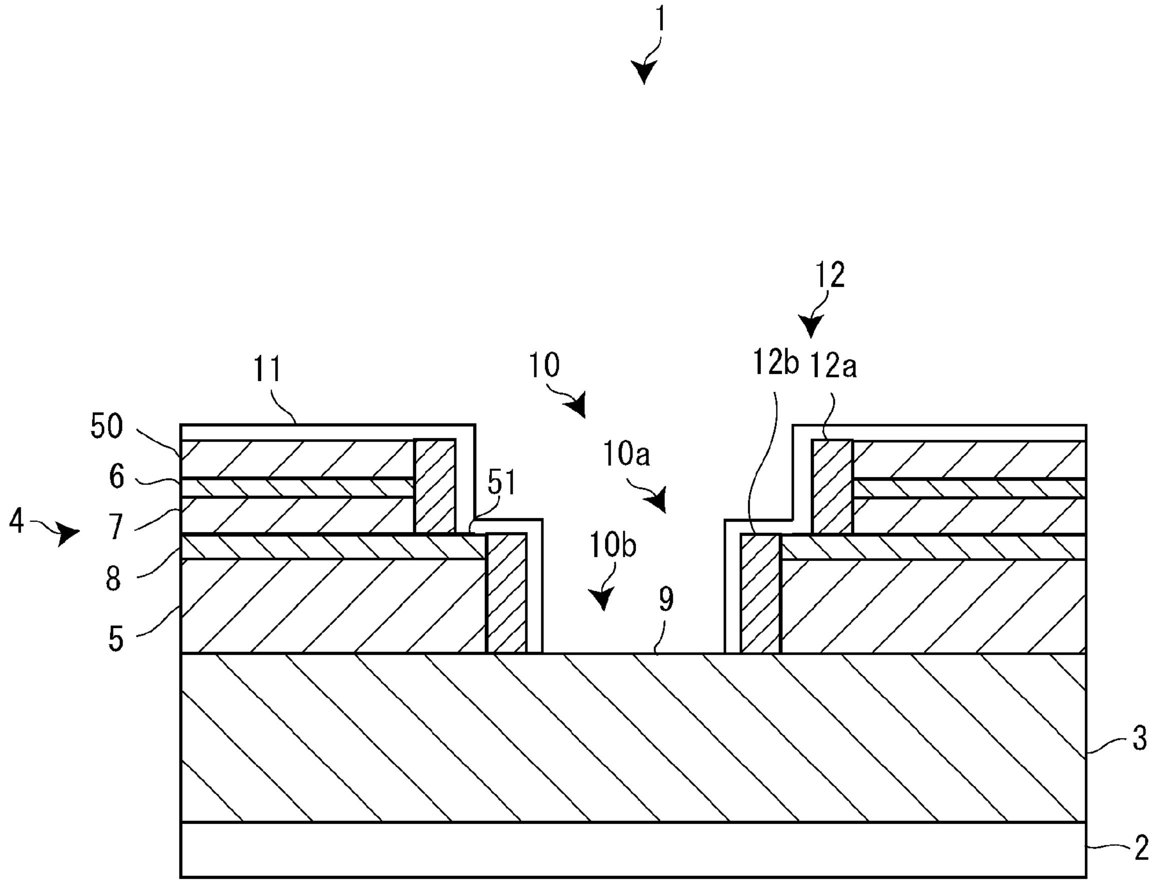
FIG. 8 is an enlarged cross sectional view around the emission concave portion of the electron emission element according to a second embodiment.
Figure 9:
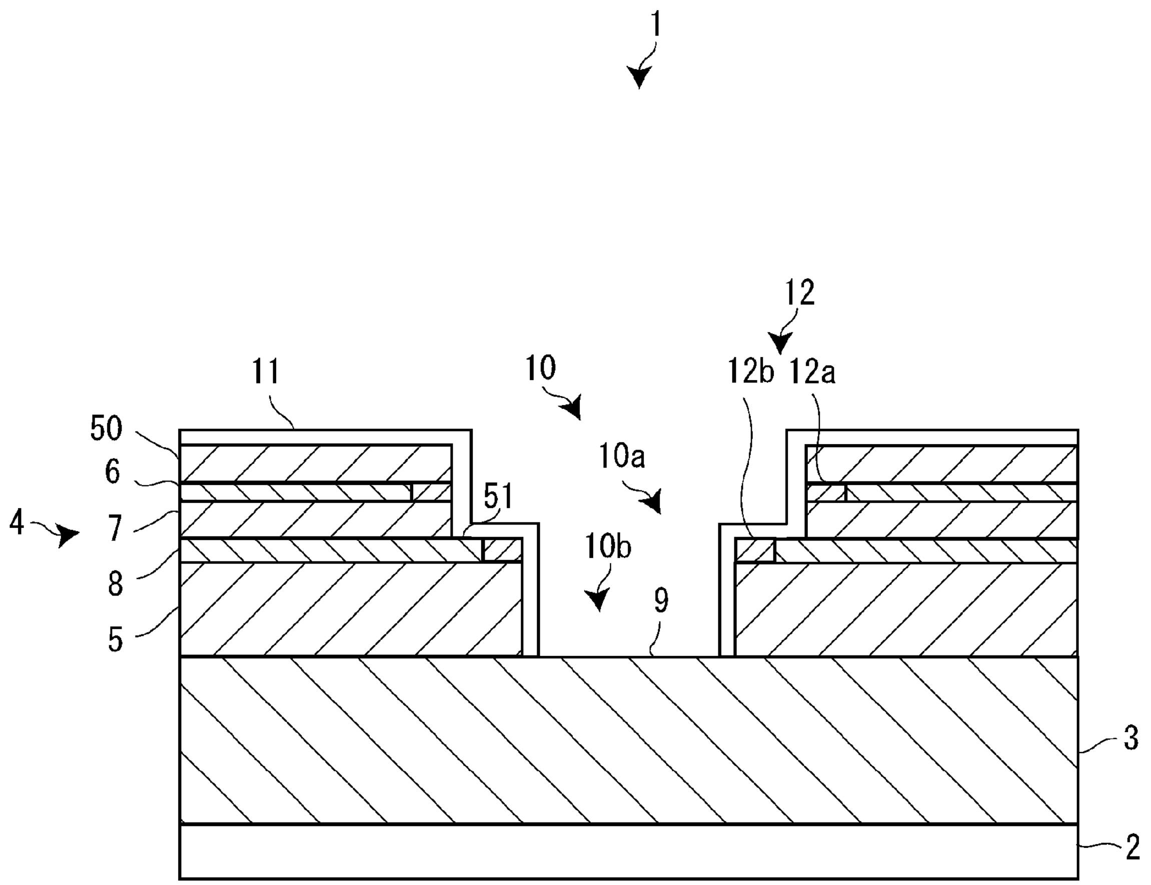
FIG. 9 is an enlarged cross sectional view illustrating a first modification of the emission concave portion of the electron emission element according to the second embodiment.
Figure 10:
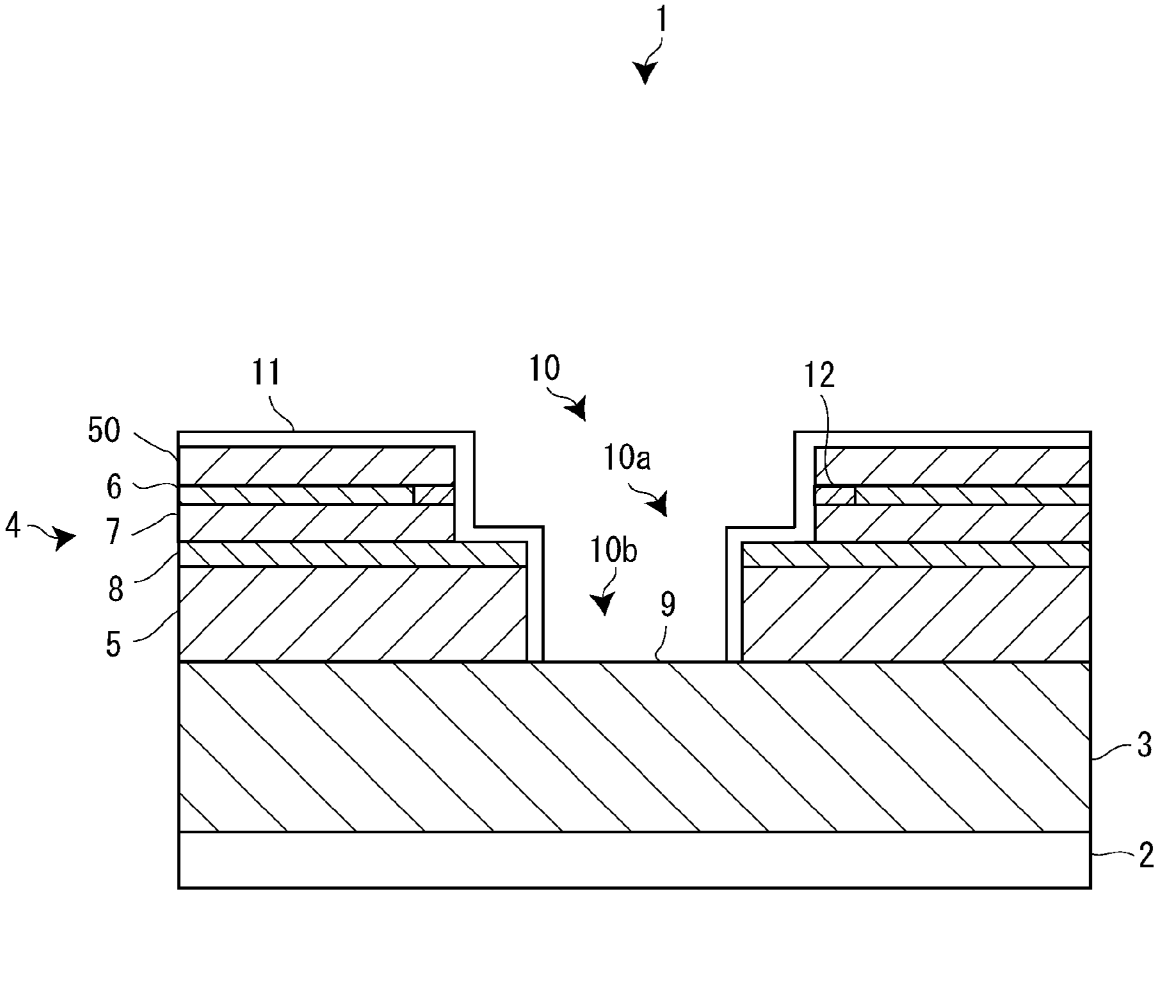
FIG. 10 is an enlarged cross sectional view illustrating a second modification of the emission concave portion of the electron emission element according to the second embodiment.

Referring to FIGS. 8 to 10, the electron emission element 1 according to the second embodiment of the invention will be explained. In the above first embodiment, the focusing electrode layer 6 is film-formed under the gate electrode layer 8 in the electrode layer portion 4, whereas in the second embodiment, the focusing electrode layer 6 is film-formed above the gate electrode layer 8 in the electrode layer portion 4. In the explanation below, same structure elements as those of the first embodiment are labeled with same numerals and detailed explanations therefor are omitted.

As illustrated in FIG. 8, the electron emission element 1 according to the second embodiment has the cathode electrode layer 2, the electron emission layer 3 stacked on the cathode electrode layer 2 and the electrode layer portion 4 formed on the electron emission layer 3. The electrode layer portion 4 has the first insulation layer 5 film-formed on the electron emission layer 3, the gate electrode layer 8 film-formed on the first insulation layer 5, the second insulation layer 7 film-formed on the gate electrode layer 8, the focusing electrode layer 6 film-formed on the second insulation layer 7 and a third insulation layer 50 film-formed on the focusing electrode layer 6. The electron emission concave portion 10 which penetrates each layer and which exposes the surface emission portion 9 at a bottom thereof is formed at the electrode layer portion 4. Further, the carbon layer 11 is film-formed on a surface of the third insulation layer 50 and the inner peripheral surface of the electron emission concave portion 10. Still further, the side wall 12 is formed between the carbon layer 11 and the inner peripheral surface of the electron emission concave portion 10.

The electron emission concave portion 10 has the third insulation layer 50 film-formed at the top portion, the upper emission concave portion 10*a* surrounded by the layer ends of the focusing electrode layer 6 and the second insulation layer 7 and the lower emission concave portion 10*b* surrounded by the layer ends of the gate electrode layer 8 and the first insulation layer 5. In the upper emission concave portion 10*a*, the third insulation layer 50, the focusing electrode layer 6 and the second insulation layer 7 are formed such that the layer ends thereof are receded with respect to the layer ends of the gate electrode layer 8 and the first insulation layer 5, and the electron emission concave portion 10 is formed such that the upper portion is larger than the lower portion as a whole. This prevents the layer end of the gate electrode layer 8 from projecting to tracks of the emitted electrons from the surface emission portion 9. Further, the upper emission concave portion 10*a* is sufficiently receded by film thickness (film width) of the side wall 12 with respect to the lower emission concave portion 10*b*, and the carbon layer 11 and the gate electrode layer 8 are in contact with each other (conduction portion 51). This prevents the carbon layer 11 from being insulated from the gate electrode layer 8 surrounded by the side wall 12 as insulation layer.

The side wall 12 has the upper side wall 12*a* formed on the inner peripheral surface of the upper emission concave portion 10*a* (layer ends of the receded third insulation layer 50, the focusing electrode layer 6 and the second insulation layer 7) and the lower side wall 12*b* formed on the inner peripheral surface of the lower emission concave portion 10*b* (layer ends of the gate electrode layer 8 and the first insulation layer 5). Further, the carbon layer 11 is evenly film-formed to cover the surface of the gate electrode layer 8, the upper side wall 12*a* and the lower side wall 12*b*. The carbon layer 11 is not film-formed on the surface emission portion 9 as the first embodiment.

Each layer film-formed at the electrode layer portion 4 is made of same material as used in the first embodiment. The third insulation layer 50 which only the electrode layer portion 4 according to the embodiment has is made of same material as that of the first insulation layer 5 and the second insulation layer 7. Though film thickness of each layer is same as that of the first embodiment, only the first insulation layer 5 which insulates the electron emission layer 3 from the gate electrode layer 8 is film-formed having 350 nm (3500 Å) film thickness so as to sufficiently insulate therebetween.

Referring to FIGS. 9 and 10, modifications of the second embodiment will be explained. FIG. 9 illustrates the electron emission element 1 according to the first modification of the second embodiment. As illustrated, the side wall 12 according to the modification has the upper side wall 12*a* formed only between the carbon layer 11 and the layer end of the focusing electrode layer 6 facing the upper emission concave portion 10*a*, and the lower side wall 12*b* formed only between the carbon layer 11 and the layer end of the gate electrode layer 8 facing the lower emission concave portion 10*b*. The upper side wall 12*a* has same film thickness (film width) as that of the second insulation layer 7 and is formed to be embedded on the inner peripheral surface of the upper emission concave portion 10*a* so as to be in alignment with the layer ends of the second insulation layer 7 and the third insulation layer 50 which sandwich the focusing electrode layer 6 from above and underneath. Thus, the focusing electrode layer 6 is sufficiently insulated from the carbon layer 11 as the gate electrode layer 8, and the side wall 12 has a structure which sufficiently prevents the focusing electrode layer 6 from conducting to the gate electrode layer 8 via the carbon layer 11.

FIG. 10 illustrates the electron emission element 1 according to a second modification of the embodiment. As illustrated, the side wall 12 according to the modification is formed only between the carbon layer 11 and the layer end of the focusing electrode layer 6 facing the upper emission concave portion 10*a*. The side wall 12 has same film thickness (film width) as that of the second insulation layer 7 as the upper side wall 12*a* in the first modification, and is formed to be embedded on the inner peripheral surface of the upper emission concave portion 10*a* so as to be in alignment with the layer ends of the second insulation layer 7 and the third insulation layer 50 which sandwich the focusing electrode layer 6 from above and beneath.

Since the side wall 12 is used for insulating between the focusing electrode layer 6 and the carbon layer 11, the side wall 12 is formed only between the focusing electrode layer 6 and the carbon layer 11 in the modification.

According to the structures above, in the electron emission element 1, since the side wall 12 which insulates the focusing electrode layer 6 from the carbon layer 11 prevents the focusing electrode layer 6 from conducting to the gate electrode layer 8 via the carbon layer 11, voltage having different electrical potential from that of the gate electrode layer 8 can be applied to the focusing electrode layer 6, thereby tracks of electrons can be efficiently focused. Especially, according to the embodiments except the modifications, the side wall 12 which insulates the carbon layer 11 from the focusing electrode layer 6 can be easily formed without complex film formation/etching processes. Further, since the focusing electrode layer 6 functions at lower voltage than that of the gate electrode layer 8, electrons can be emitted by low voltage as a whole.

Since the imaging device 100 having the electron emission elements 1 can focus emitted electrons on the surface of the photoelectric conversion layer 123 efficiently, it is possible to provide the imaging device 100 of a power saving type having high detection accuracy.

REFERENCE NUMERALS

1: electron emission element 2: cathode electrode layer 3: electron emission layer 5: first insulation layer 6: focusing electrode layer 7: second insulation layer 8: gate electrode layer 9: surface emission portion 10: electron emission concave portion 11: carbon layer 12: side wall 12*a*: upper side wall 12*b*: lower side wall 50: third insulation layer 100: imaging device 110: electron emission substrate section 111: silicon substrate 120: light reception section 121: glass substrate 122: anode electrode layer 123: photoelectric conversion layer 130: mesh electrode

What is claimed is:

1. An electron emission element comprising:

an electron emission layer that emits an electron from a surface emission portion;

a focusing electrode layer that is film-formed on a surface of the electron emission layer via a first insulation layer and focuses the emitted electron;

a gate electrode layer that is film-formed on a surface of the focusing electrode layer via a second insulation layer;

an emission concave portion that penetrates the gate electrode layer, the second insulation layer, the focusing electrode layer and the first insulation layer and opens in a concave shape on a surface of the surface emission portion;

a carbon layer that is film-formed from a surface of the gate electrode layer over an inner peripheral surface of the emission concave portion; and a partial insulation portion that is film-formed by a different process from the first insulation layer and the second insulation layer and that insulates the focusing electrode layer from the carbon layer, the partial insulation portion being made up of at least a side wall disposed between the carbon layer and the focusing electrode layer among side walls that are disposed between the carbon layer and the gate electrode layer, between the carbon layer and the second insulation layer, between the carbon layer and the focusing electrode layer, and between the carbon layer and the first insulation layer.

2. An electron emission element comprising:

an electron emission layer that emits an electron from a surface emission portion;

a gate electrode layer that is film-formed on a surface of the electron emission layer via a first insulation layer;

a focusing electrode layer that is film-formed on a surface of the gate electrode layer via a second insulation layer and focuses the emitted electron;

a third insulation layer that is stacked on a surface of the focusing electrode layer;

an emission concave portion that penetrates the third insulation layer, the focusing electrode layer, the second insulation layer, the gate electrode layer and the first insulation layer, and opens in a concave shape on a surface of the surface emission portion;

a carbon layer that is film-formed from a surface of the third insulation layer over an inner peripheral surface of the emission concave portion; and a partial insulation portion that is film-formed by a different process from the first insulation layer, the second insulation layer and the third insulation layer and that insulates the focusing electrode layer from the carbon layer, the partial insulation portion being made up of at least a side wall disposed between the carbon layer and the focusing electrode layer among side walls that are disposed between the carbon layer and the third insulation layer, between the carbon layer and the focusing electrode layer, between the carbon layer and the second insulation layer, between the carbon layer and the gate electrode layer, and between the carbon layer and the first insulation layer.

3. The electron emission element according to claim 1, wherein film thickness (film width) of the side wall is formed to be approximately equal to thickness of the second insulation layer to achieve same insulation performance therebetween.

4. The electron emission element according to claim 2, wherein film thickness (film width) of the side wall is formed to be approximately equal to thickness of the second insulation layer to achieve same insulation performance therebetween.

5. The electron emission element according to claim 1, wherein the electron emission layer is made from amorphous silicon, and the partial insulation portion is made of oxide or nitride.

6. The electron emission element according to claim 2, wherein the electron emission layer is made from amorphous silicon, and the partial insulation portion is made of oxide or nitride.

7. The electron emission element according to claim 1, wherein voltage is applied to the gate electrode layer and the focusing electrode layer respectively such that electric potential of the focusing electrode layer is lower than that of the gate electrode layer.

8. The electron emission element according to claim 2, wherein voltage is applied to the gate electrode layer and the focusing electrode layer respectively such that electric potential of the focusing electrode layer is lower than that of the gate electrode layer.

9. The electron emission element according to claim 7, wherein the electric potential of the focusing electrode layer is negative electric potential.

10. The electron emission element according to claim 8, wherein the electric potential of the focusing electrode layer is negative electric potential.

11. The electron emission element according to claim 1, wherein the emission concave portion is formed to be larger in an electron emission direction.

12. The electron emission element according to claim 2, wherein the emission concave portion is formed to be larger in an electron emission direction.

13. An imaging device comprising:

an electron emission substrate section that has the electron emission element set forth in claim 1 and a cathode electrode; and a light reception substrate section that faces the electron emission substrate section having vacuum space therebetween, and has a photoelectric conversion layer and an anode electrode.

14. An imaging device comprising:

an electron emission substrate section that has the electron emission element set forth in claim 2 and a cathode electrode; and a light reception substrate section that faces the electron emission substrate section having vacuum space therebetween, and has a photoelectric conversion layer and an anode electrode.

* * * * *